(12) United States Patent
Mundt

(10) Patent No.: US 6,542,835 B2
(45) Date of Patent: Apr. 1, 2003

(54) DATA COLLECTION METHODS AND APPARATUS

(75) Inventor: Randall S. Mundt, Pleasanton, CA (US)

(73) Assignee: OnWafer Technologies, Inc., Pleasant Hill, CA (US)

( * ) Notice: Subject to any disclaimer, the term of this patent is extended or adjusted under 35 U.S.C. 154(b) by 0 days.

(21) Appl. No.: 09/816,648

(22) Filed: Mar. 22, 2001

(65) Prior Publication Data

US 2002/0165678 A1 Nov. 7, 2002

(51) Int. Cl.$^7$ .............................................. G06F 19/00
(52) U.S. Cl. .......................................... 702/65; 702/104
(58) Field of Search .............................. 702/64, 65, 90, 702/104, 117

(56) References Cited

U.S. PATENT DOCUMENTS

| | | | | |
|---|---|---|---|---|
| 4,374,384 A | * | 2/1983 | Moates | 340/870.38 |
| 4,547,898 A | | 10/1985 | Tsikos | 382/4 |
| 4,973,956 A | | 11/1990 | Lin et al. | 340/825.86 |
| 5,429,006 A | | 7/1995 | Tamori | 73/862.046 |
| 5,469,154 A | | 11/1995 | Karp | 340/825.8 |
| 5,729,905 A | * | 3/1998 | Mathiasmeier et al. | 33/3 R |
| 5,967,661 A | | 10/1999 | Renken et al. | 374/126 |
| 6,244,121 B1 | | 6/2001 | Hunter | 73/865.9 |
| 6,387,329 B1 | * | 5/2002 | Lewis et al. | 422/98 |

OTHER PUBLICATIONS

"Autonomous Micro–sensor Arrays for Process Control of Semiconductor Manufacturing Processes," Darin Fisher, Mason Freed, Kameshwar Poolla and C. J. Spanos—U.C. Berkeley, Presented: Proceedings of the 38th Conference on Decision and Control–Dec. 7–10, 1999. Presentation on Dec. 10, 1999.

"Micro–sensor Arrays for Calibration, Control, and Monitoring of Semiconductor Manufacturing Processes," Darin Fisher, Mason Freed, Kameshwar Poolla and C. J. Spanos—U.C. Berkeley, Presented: 1999 IEEE International Conference on Control Applications, Aug. 22–26, 1999. Presentation on Aug. 24, 1999.

U.S. patent application Ser. No. 09/643,614, filed Aug. 22, 2000.

* cited by examiner

*Primary Examiner*—Marc S. Hoff
*Assistant Examiner*—Craig Steven Miller
(74) *Attorney, Agent, or Firm*—Larry Williams

(57) ABSTRACT

Information transfer is effected using a network of electrical signal conductors and sensors forming crosspoint connections. The sensors are capable of representing a measurement parameter as an electrical impedance. One embodiment of the present invention includes output electrical conductors, input electrical conductors, and sensors. Each of the sensors is connected with one of the output electrical conductors and one of the input electrical conductors so as to form an array of crosspoint connections. Application of electrical signals to the sensors and measurement of electrical signals from the sensors provide sufficient information to derive relative information from each sensor using algorithms based on equations for combining impedance. The embodiment may further include one or more reference elements connected with the output electrical conductors and with the input electrical conductors so as to form crosspoint connections. The reference elements have predetermined impedances and may be used to determine the impedance values for particular sensors.

27 Claims, 7 Drawing Sheets

DATA COLLECTION METHODS AND APPARATUS

CROSS-REFERENCE

The present application is related to U.S. patent application Ser. No. 09/643,614, now pending, filed on Aug. 22, 2000. U.S. patent application Ser. No. 09/643,614, filed on Aug. 22, 2000 is incorporated herein, in its entirety, by this reference.

BACKGROUND

This invention relates to improved methods and apparatus for collecting information, more particularly, electronically collecting data from multiple locations such as, for example, data collection from an array of sensors.

The successful and cost effective manufacture of many common components (e.g. integrated electronic circuits) requires that processing conditions or properties be maintained at optimal values over relatively large areas or volumes. The ability to obtain process condition data from many, discrete locations within a processing system (i.e. spatially resolved data) is very valuable in establishing and maintaining optimal component yields and performance. Further, many common processing operations require that process variables change in a consistent, reproducible way as a function of time (i.e. process trajectory) rather than have a single, time independent value. The ability to obtain process condition data at many, discrete points in time (i.e. temporally resolved data) is also very valuable in establishing and maintaining optimal component yields and performance.

Most sensors and sensing methods either obtain data at discrete physical locations (e.g. thermocouples measuring temperature) or measure an average (or integrated) value for the entire process area or volume (e.g. optical emission from a plasma discharge). These limitations are usually an inherent property of the sensor and/or measurement parameter. There are a number of standard methods and approaches that have been developed in an attempt to obtain spatially and temporally resolved process data, each of which has its own set of strengths and weaknesses.

One of the standard methods uses swept sensors that include a sensing element wherein the sensing element is physically moved within the processing area while multiple measurements are being made. The individual measurements are then correlated with the sensor location to produce a spatially resolved mapping of the parameter of interest. The primary advantage of this method is that only a single sensor and measurement system is needed. The disadvantages are: the spatial data is strongly convoluted with any temporal variations (i.e. one cannot know if the signal changed as a function of time or location or both), and the often-undesirable difficulties of physically moving an object within the processing environment.

Another standard method involves deconvolution of integrated sensor data. Specifically, multiple measurements of an integrated value are made (e.g. line-of-sight optical emission) wherein the multiple measurements contain a different mix of the measurements (e.g. different viewpoint). The primary advantage of this approach is that only a small number of sensors and measurement systems are needed, possibly even only one. A primary disadvantage is that the deconvolution of the sensor data set to produce a spatially resolved map is subject to mathematical assumptions and requirements that are difficult to achieve in real world measurements. In addition, the mathematical techniques used to deconvolute the sensor data tend to be very noise sensitive such that small sensor errors can lead to large spatial errors.

One of the most straightforward of the standard spatial mapping approaches uses multiple, fixed sensors. In a typical arrangement, numerous, identical sensors are simply distributed throughout the area or volume of interest. The primary advantage is one of simplicity in both data acquisition and analysis; spatial and temporal effects are completely decoupled. The primary disadvantage is the large number of sensors and measurement systems required to obtain the desired spatial resolution. For some applications, the cost and complexity of installing and maintaining a large number of independent sensors and the respective data collection network are unacceptably high. This is particularly true for applications such as those where spatial and temporal sensor maps are desired for process tools such as those used for electronic device fabrication. Indeed, when this approach is used for characterizing process tools, it is usually limited to very coarse spatial resolution applications and only uses a relatively small number of sensors.

Clearly, there are numerous applications requiring reliable and efficient methods and apparatus for spatially resolved and time resolved data collection from one or more sensors. In addition, there is a need for methods and apparatus capable of acquiring highly spatially resolved measurements while avoiding or minimizing one or more disadvantages of the standard methods. Furthermore, there is a need for methods and apparatus capable of accommodating multiple sensor types and capable of measuring multiple parameters. Still further, there is a need for methods and apparatus that enable limited data acquisition and measurement resources to be more efficiently shared by a large number of sensors.

SUMMARY

This invention pertains to improve data acquisition such as for mapping one or more parameters spatially, temporally, or spatially and temporally. The present invention seeks to overcome one or more of the deficiencies of the standard technologies for data acquisition.

Practicing aspects of the present invention includes activating multiple crosspoint nodes by applying electrical signals to the crosspoint nodes simultaneously and making measurements for one or more activation states. Data from one or more nodes are then mathematically extracted from the set of measurement data.

One aspect of the present invention includes apparatus for acquiring data. In one embodiment, the apparatus includes output electrical conductors, input electrical conductors, and sensors. The sensors are capable of presenting a measured parameter as an electrical impedance. Each of the sensors is connected with one of the output electrical conductors and one of the input electrical conductors so as to form an array of crosspoint connections. Applying electrical signals to the output electrical conductors and measuring electrical signals at the input electrical conductors, generates sufficient information to derive the measured parameter of each sensor using algorithms that include equations for combining electrical impedances.

In a further embodiment, the apparatus includes a controller for applying the electrical signals and for measuring the electrical signals.

Another aspect of the present invention includes methods of acquiring data. In one embodiment, the method is used for obtaining data from an array of sensors in a crosspoint network. The sensors are capable of representing one or more measured parameters as electrical impedance. The method includes the step of applying a pattern of electrical signals to the sensors. The method also includes measuring electrical signals from the sensors. Still further, the method includes the step of deriving measurement data for each of the sensors using the measured electrical signals and algorithms that include equations for combining electrical impedances.

Another aspect of the present invention includes a computer-implemented algorithm for deconvoluting combined electrical impedances from an array of sensors. The algorithm is derived from equations that represent combined discrete impedances. The equations are manipulated to obtain a set of equations having the number of unknowns equal to or less than the number of equations. The algorithm further includes the mathematical steps for solving the equations using measured electrical data representing the combined impedances.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out aspects of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is not intended to define the invention of the application, which is measured by the claims, nor is the abstract intended to be limiting as to the scope of the invention in any way.

The above and still further features and advantages of the present invention will become apparent upon consideration of the following detailed descriptions of specific embodiments thereof, especially when taken in conjunction with the accompanying drawings.

DESCRIPTION

Figure 1:
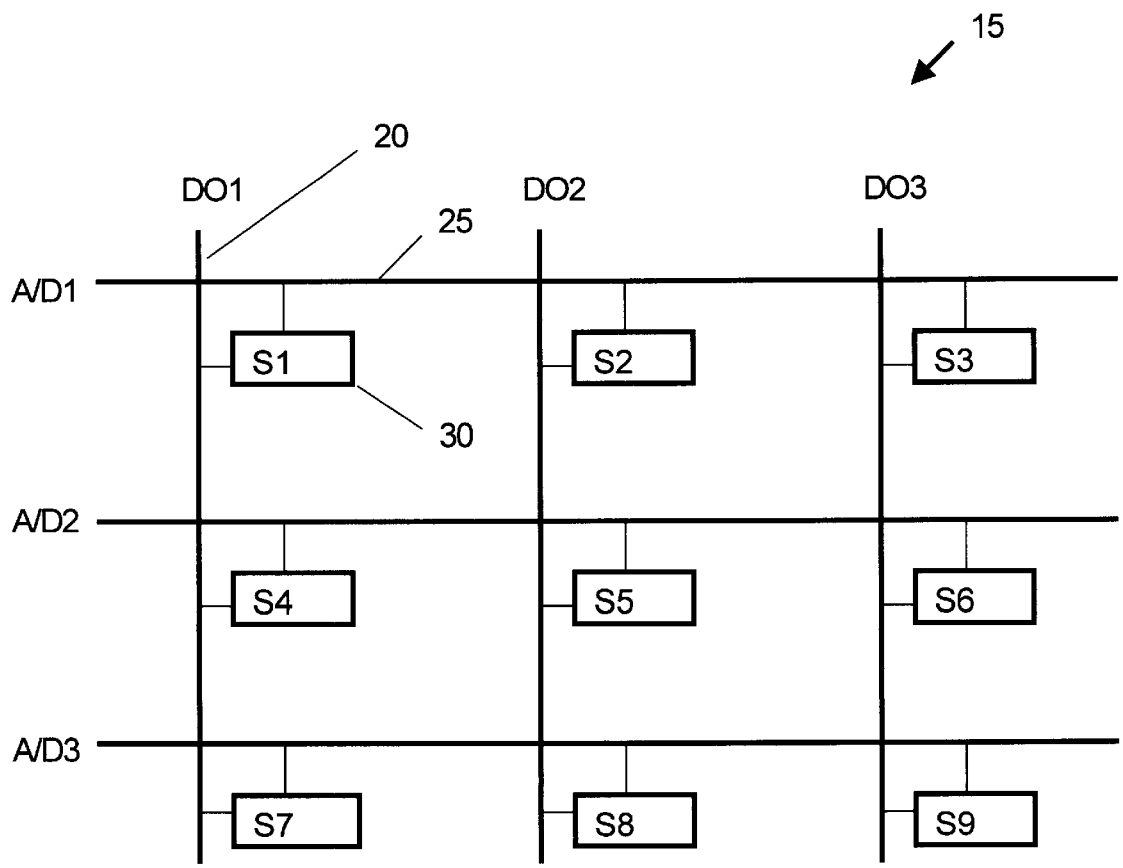
FIG. 1 is a diagram of an embodiment of the present invention.

The operation of embodiments of the present invention will be discussed below, primarily, in the context of obtaining information from an array of sensors. However, it is to be understood that embodiments in accordance with the present invention are not limited to sensor applications.

In the following description of the figures, identical reference numerals have been used when designating substantially identical elements or steps that are common to the figures.

Practicing embodiments of the present invention includes activating multiple sensors by applying electrical signals to the sensors (i.e. crosspoint nodes) simultaneously and making measurements for each activation state. For example, if the activation involves a current, then current flows through all sensors every measurement. The value at each sensor is then mathematically extracted from the set of measurement data. No single measurement contains data from only one sensor; each measurement has a mixture of data from each sensor.

Embodiments of the disclosed invention may include at least one input electrical conductor, at least two output electrical conductors, and at least two sensors. The conductance characteristics (I-V behavior) of the sensors are a function of a parameter to be measured. The electrical conductors and sensors are arranged to form a crosspoint array wherein the rows (horizontal conductors) are formed by the input electrical conductors, the columns (vertical conductors) are formed by the output electrical conductors, and the sensors are connected between the output electrical conductors and the input electrical conductors at each crossing point (nodes).

To better illustrate embodiments of the present invention, reference is now made to FIG. 1 wherein there is shown a diagram for a sensor array 15 according to an embodiment of the present invention. Sensor array 15 includes three output electrical conductors 20, three input electrical conductors 25, and nine sensors 30. Each of the sensors 30 are connected with one of the output electrical conductors 20 so that sensors 30 can receive electrical signals via output electrical conductors 20. In addition, each of the sensors 30 is connected with one of the input electrical conductors 25 so that sensors 30 can send electrical signals via input electrical conductors 25. This arrangement results in a network where sensors 30 serve as crosspoint connections between output electrical conductors 20 and input electrical conductors 25.

A variety of electrically conductive materials and material configurations are suitable for use in output electrical conductors 20 and input electrical conductors 25. For example, conductors 20 and conductors 25 may comprise conducting wires such as bulk wires, fine gauge wires, and electrical conductors formed by thin film techniques.

Depending on the nature of conductors 20 and conductors 25, the conductors may serve as a frame for supporting sensors 30 in some embodiments. Such a configuration would be suitable for embodiments where the electrical conductors are rugged enough and large enough to serve in this capacity. In alternative embodiments, the sensors may be supported on a separate substrate (not shown in FIG. 1). As a further embodiment, the electrical conductors may be formed on the surface of the substrate and arranged so that they form the electrical connections between the sensors.

Sensors 30 may include any type of sensors capable of representing a measured parameter as an electrical impedance. Suitable sensors include sensors that directly present electrical impedance values related to the measured parameter. Other suitable sensors include sensors having circuitry capable of transforming information representing the measured parameter into a corresponding electrical impedance.

The impedance exhibited by the sensors may include any one or combinations of resistance, capacitance, and inductance. Examples of suitable sensors include sensors such as thermistors, photoresistors, photoconductors, photodiodes, and sensors that include active electronic devices, nonlinear electronic junctions, MOSFET devices, and ion sensitive membranes.

If sensors 30, shown in FIG. 1, are assumed to be thermistors then an embodiment of a suitable method for using sensor array 15 may include the following steps. Electrical signals such as, for example, a pattern of high and low voltages are applied to output conductors 20, labeled DO lines. In preferred embodiments, there are at least one high output voltage and at least one low output voltage. Preferably, output conductors 20, the DO lines, have significantly lower impedance than sensors 30; this is assumed to be true for this example embodiment. An example pattern of high and low voltages for the embodiment shown in FIG. 3 may include a high voltage, Vhigh, on output conductor 20 indicated as DO1 and low voltages, Vlow, on output conductors 20 indicated as DO2 and DO3.

Voltage measurements are made on input electrical conductors 25, labeled A/D1 through A/D3. Preferably, the voltage measurement hardware has significantly higher impedance than the sensors; this is assumed to be true for this example embodiment.

The voltage appearing at input electrical conductor 25, labeled A/D1, will thus be determined by the resistive voltage divider formed by the resistance of sensor 30, labeled S1, in series with the parallel combination of the resistances of sensors 30, labeled S2 and S3. Consequently, the equation for the voltage V(A/D1) at input electrical conductor 25 labeled A/D1 is given by the equation $$V(A/D1)=Vlow+(Vhigh-Vlow)*(S2*S3)/(S2+S3)/(S1+(S2*S3)/(S2+S3))$$

where in this equation:

S represents resistance,

Resistance of S2 and S3 in parallel=(S2*S3)/(S2+S3),

Total resistance=(S1+(S2*S3)/(S2+S3)).

In a similar manner, the voltages appearing at input electrical conductors 25, labeled A/D2 and A/D3, are functions of sensors 30, S4 through S9. As various patterns of Vhigh and Vlow are applied to output electrical conductors 20, similar relationships between the voltages measured at input electrical conductors 25 and resistance information for sensors 30 can be derived. Specifically, well-known linear algebra techniques and the set of measurements can be used to obtain ratios that equal the resistance values for each sensor 30 and any other sensor 30 directly connected to the same input electrical conductor 25. In other words, the ratios indicate changes in the measurements provided by the sensors. Spatially resolved parameter maps and temporally resolved parameter maps can be obtained showing the relative changes in the parameter measurements for each sensor.

It is to be understood that embodiments of the present invention can be used to measure relative information for substantially any sensor wherein the sensor measurements can be expressed as electrical impedance and there is a change in impedance, either real (resistance) or imaginary (capacitive or inductive) or a mixture of the two.

Additional examples of patterns of high and low voltages that can be used to obtain sets of measurements are: all voltages low except one i.e. LLLLLHLLLLLL; every other voltage high i.e. LHLHLHLHLHLH; all voltages high except one i.e. HHHHHHLHHHHH; and any other combination of voltages where at least one line is at high voltage and at least one line is at low voltage. Preferred patterns will depend upon the characteristics of the sensors at the nodes. A more complex activation pattern may be needed for sensors that have highly nonlinear responses such as for example the responses for Zener diodes. For parameter measurements using some types of nonlinear sensing elements, the output stimulus patterns cannot be predefined. In some embodiments of the present invention, the electrical signals applied to the sensors need to be "ramped" until a change is detected on the input electrical conductors.

For imaginary impedance, a high voltage case would mean applying a specific amplitude AC signal to a line and a low voltage would be a different, lower amplitude AC signal. For ease of generation and analysis, the high and low frequencies, preferably, would be the same.

One embodiment of the present invention uses approximately 3 volts as a high voltage and near 0 volts, such as at about ground, as a low voltage. For accurate parameter measurements, it is preferable to be able to measure with reasonable accuracy the values of voltages between the high and low points. The specific selection of a high and low is usually set by factors such as what voltages are available, what voltages the sensors require for operation, and the preferred voltage range for analog to digital conversion.

The number of sensors that can be measured using embodiments of the present invention is thus the product of the number of input electrical conductors and the number of output electrical conductors. In the example just given, nine sensors were accommodated with three output electrical conductors and three input electrical conductors. Similarly, 25 sensors can be accommodated with five output electrical conductors and five input electrical conductors, and 100 sensors can be accommodated with the 10 output electrical conductors and 10 input electrical conductors. Consequently, embodiments of the present invention allow large numbers of sensors to be networked to provide information using a relatively small number of input and output electrical conductors.

For comparison, mapping parameters with an array of 100 sensors, according to standard mapping technology, would require an input line and an output line for each sensor for independently wired sensors. In other words, 200 electrical lines would be required. However, embodiments of the present invention can provide an equivalent amount of mapping capabilities using only 20 electrical lines. Embodiments of the present invention can significantly reduced the number of electrical lines and reduced the general complexity of wiring sensor arrays.

The reduction in wiring complexity that can be provided by embodiments of the present invention is particularly important in certain applications where a large number of sensors are needed in a relatively small area or volume. For example, parameter mapping for applications related to processing electronic devices might require a large number of sensors arranged in an area the size of typical workpieces for such applications. Specifically, for typical present day semiconductor processing this means an area about equal to the size of a typical semiconductor wafer, an area having a diameter of from about 100 mm to about 300 mm.

In addition, for some applications it is desirable to have the sensor apparatus as non-intrusive as possible. Preferably, the sensor apparatus should provide little or no perturbation to the parameter measurements. Reducing the amount of required wiring and the complexity of the wiring is beneficial in this regard. In other words, embodiments of the present invention can offer additional benefits of reducing the possibility of measurement perturbations because the wiring requirements are far simpler than some of the standard technologies.

Still another advantage of the simpler wiring requirements for embodiments of the present invention is the reduced fabrication complexity. Not only is the actual fabrication easier, the post fabrication testing and quality assurance is simpler also because there are fewer electrical lines to be examined.

In another embodiment of the present invention, the information for each sensor can be obtained directly. In other words, the impedance value for each sensor can be determined rather than obtaining ratios of impedances. This means that the impedances can be converted to indicate values for the parameter being measured. The capability of obtaining impedance values for each sensor is the result of hardware modifications to the sensor array. For illustration, reference is now made to FIG. 1a wherein there is shown sensor array 15 having output electrical conductors 20, input electrical conductors 25, and sensors 30. Output electrical conductors 20, input electrical conductors 25, and sensors 30 are all essentially the same as those described for the embodiment illustrated in FIG. 1 with the exception that there are six sensors 30 and added to the network are three reference elements 35 labeled as R1, R2, and R3 in FIG. 1a. Reference elements 35 are connected to output electrical conductors 20 and input electrical conductors 25 to form crosspoint connections therebetween. In other words, reference elements 35 form crosspoint connections in essentially the same way that sensors 30 form crosspoint connections between output electrical conductors 20 and input electrical conductors 25. Preferably, reference elements 35 populate each crossing point along one of the output conductor lines 20.

Reference elements 35 have predetermined impedances. Preferably, the predetermined impedances result from reference elements 35 having a substantially constant impedance with respect to the parameter being measured. The predetermined impedances of reference elements 35 can be incorporated into the equations used for deriving the measurement parameters for each of the sensors. Including information for reference elements 35 reduces the number of unknowns. This permits calculation of information for each of the sensors as ratios of the sensor impedances to the reference element impedances. The impedances for the reference elements are predetermined, thus, allowing the impedances of the sensors to be determined using the ratios.

Including reference elements with predetermined resistance values in the example given earlier where the sensors are thermistors creates a special case for the calculations. In this special case, the ratio of the sensor resistance to the reference resistance is identical to the ratio of the measured voltages. The resistance values for each of the sensors can be obtained using the voltage ratios and the predetermined resistances for the reference elements. The following illustrative example provides more details and example equations.

Figure 1A:
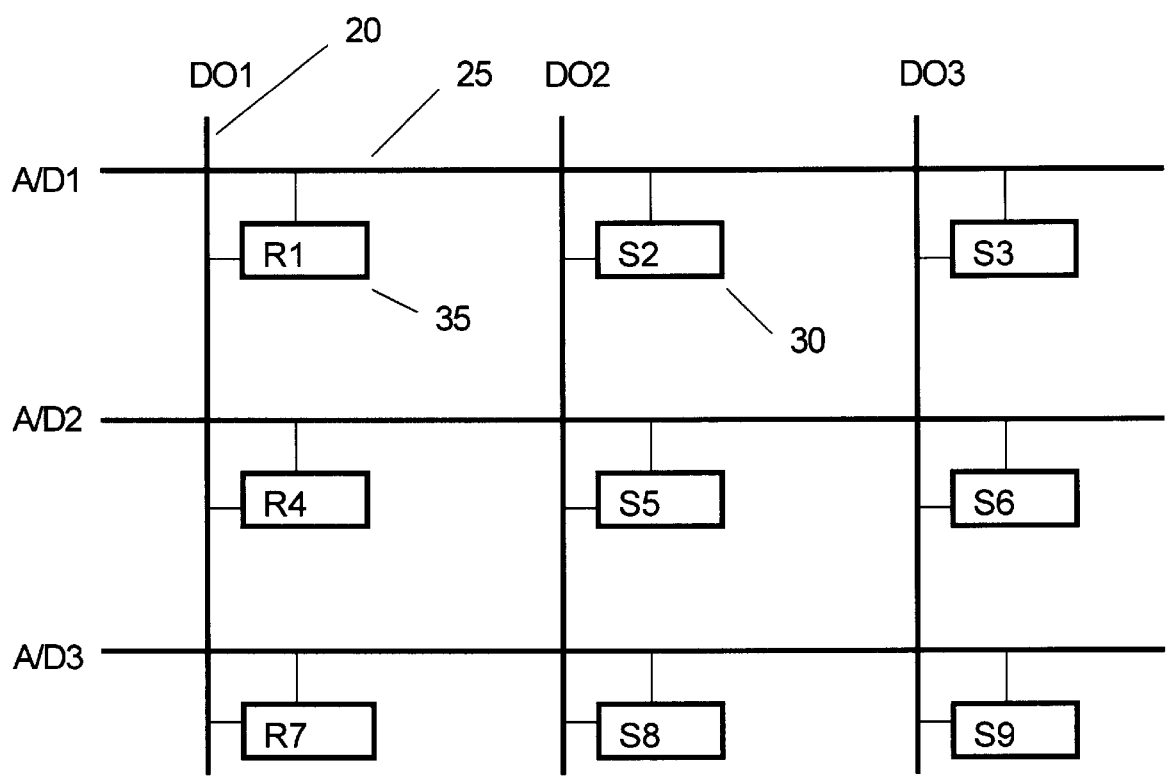
FIG. 1a is a diagram of an embodiment of the present invention.

Referencing FIG. 1a, if one of the output electrical conductors 20 is brought to high voltage, Vhigh, and the other output electrical conductors 20 are held to about electrical ground, an equivalent circuit can be used to describe the electrical characteristics of each input electrical conductor 25. In an example set of measurements, a pattern of electrical signals brings each of the output electrical conductors 20 to Vhigh once, and the resultant voltage at the input electrical conductors 25 are recorded. The voltage developed at input electrical conductors 25 when reference elements 35 are brought to Vhigh is given by the following equation:

$$V_s = \frac{\frac{R_p R_r}{R_p + R_r}}{\frac{R_p R_r}{R_p + R_r} + R_s} Vhigh = \frac{R_p R_r}{R_p R_r + R_s(R_p + R_r)} Vhigh$$

where:

$R_r$ is resistance of the reference element, $R_s$ is resistance of a single sensor, and $R_p$ is parallel resistance of the other sensors.

Similarly, the equation that gives the analog voltage for the case when the sensor is brought to Vhigh is:

$$V_r = \frac{R_p R_s}{R_p R_s + R_r(R_p + R_s)} V_{dd}$$

Dividing these two equations results in the following relation:

$$\frac{V_r}{V_s} = \frac{\frac{R_p R_s}{R_p R_s + R_r(R_p + R_s)} V_{dd}}{\frac{R_p R_r}{R_p R_r + R_s(R_p + R_r)} V_{dd}} = \frac{\frac{R_p R_s}{R_p R_s + R_r R_p + R_r R_s}}{\frac{R_p R_r}{R_p R_r + R_s R_p + R_s R_r}} = \frac{R_s}{R_r}$$

Therefore, by finding the ratio of the voltages for the two experiments, and using the known resistance of the reference element, the unknown sensor resistance can be computed.

Figure 2:
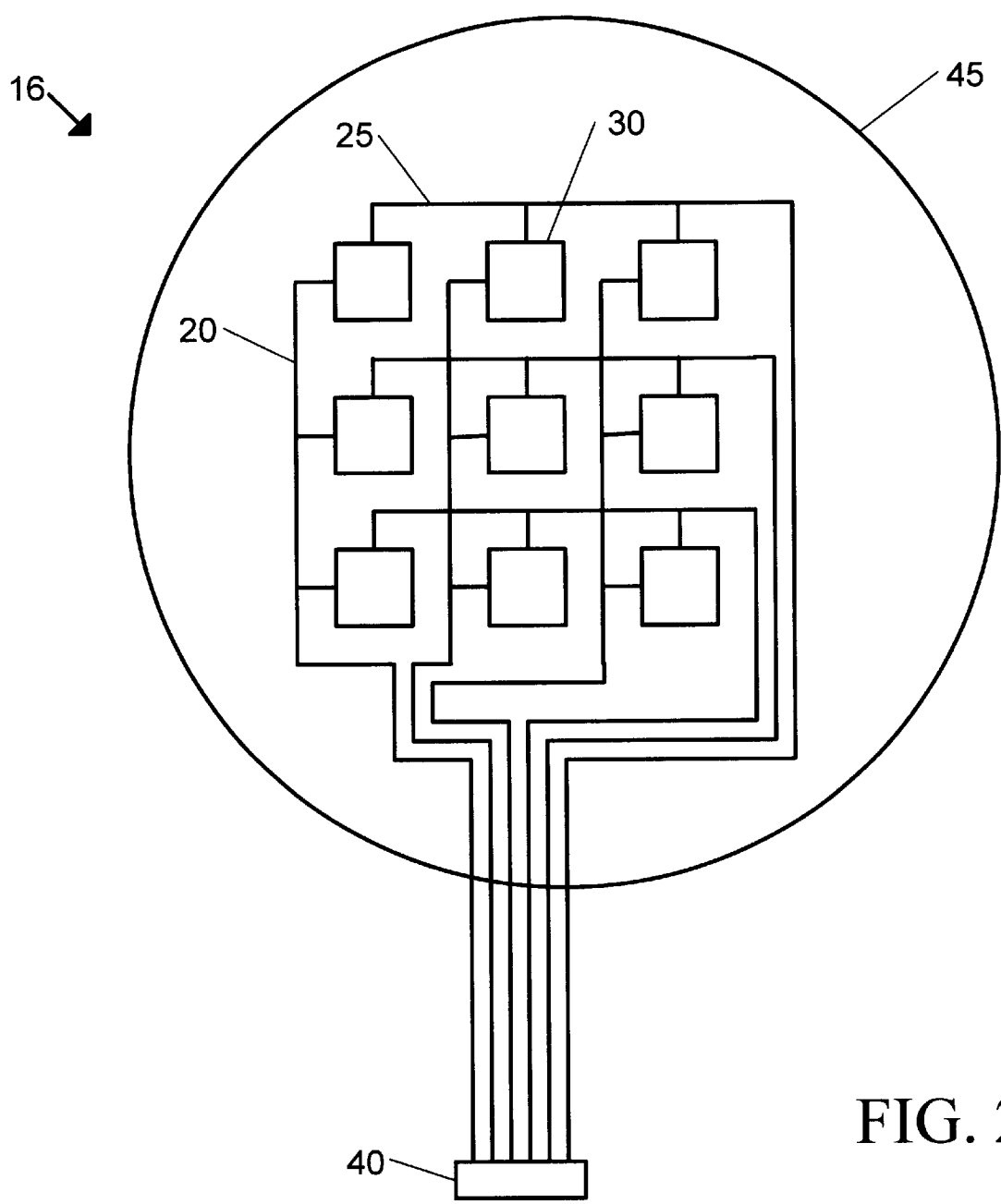
FIG. 2 is a diagram of a top view of an embodiment of the present invention.

Reference is now made to FIG. 2 wherein there is shown a top view of an embodiment of the present invention. A sensor apparatus 16 is shown having output electrical conductors 20, input electrical conductors 25, and sensors 30. Conductors 20, conductors 25, and sensors 30 are essentially the same as those described for the embodiment shown in FIG. 1.

Sensor apparatus 16 further includes a controller 40. Controller 40 is connected with output electrical conductors 20. Controller 40 is capable of applying electrical signals to sensors 30 via output electrical conductors 20. Controller 40 is also connected with input electrical conductors 25 so that controller 40 can measure electrical signals from sensors 30 via input electrical conductors 25. In other words, controller 40 is capable of measuring electrical signals and applying electrical signals.

Those skilled in the art are aware that there are numerous commercially available controllers that are suitable for controller 40. In addition, a variety of types of controllers are commercially available that can be used for controller 40. In one embodiment, controller 40 may include electronic devices such as microprocessors for controlling the measurement of electrical signals from input conductors 25 and for controlling the application of electrical signals to output conductors 20. Furthermore, controller 40 may include computer readable memory for storing data and instructions. Still further, controller 40 may be capable of transmitting data and instructions to a second location. In other embodiments, controller 40 may comprise a computer such as for example a personal computer. Optionally, the personal computer may be included in a computer network.

In another embodiment, controller 40 includes two separate but coordinated control systems. One control system generates the pattern of electrical outputs to the sensors, and the other control system measures the electrical signals from the sensors.

In some embodiments, controller 40 may be located remotely from sensors 30. This embodiment may be preferred in applications where the mapping parameters include extreme conditions compared to conditions suitable for the functioning of typical electronic devices. For example, remotely locating controller 40 may be preferable for applications where the parameter mapping involves exposing sensors 30 to extreme conditions such as for example high temperatures.

Sensor apparatus 16 also includes, as an option, a substrate 45 for supporting sensors 30. Supporting sensors 30 on substrate 45 allows the array of sensors to be handled as a single unit. This capability may be preferred for some applications. A further use of a substrate 45 may be to provide support for conductors 20 and conductors 25. In some embodiments, conductors 20 and conductors 25 may include patterned lines of conductors fabricated from the deposition of conducting films. For example, conductors 20 and conductors 25 may include electrical conductors fabricated using well known electronic device metallization technologies for electrically connecting electronic devices.

Substrate 45 may be of any type suitable for the particular sensing application. Specifically, the physical characteristics of the substrate can be selected based on the application. For applications involving semiconductor electronic device processing, the preferred substrate would include semiconductor materials typically used in semiconductor device processing. Similarly, for applications related to flatpanel display technology, the preferred substrate would include materials typically used for manufacturing flatpanel display devices. Photolithography mask materials would be preferred substrates for photolithography applications.

In addition to reducing the complexity of the electrical wiring, embodiments according to the present invention also require fewer electrical ports than are required for some of the standard methods for parameter mapping. Using embodiments of the present invention, the number of electrical ports required for sending electrical signals to the sensors and receiving electrical signals from the sensors equals the sum of the number of input electrical conductors and the number of output electrical conductors.

Specifically, for each of the output electrical conductors the controller may preferably have one electrical port for sending electrical signals to the sensors. Similarly, for each input electrical conductor the controller may preferably have one electrical port for measuring the electrical signal. Consequently, embodiments of the present invention may include 100 sensors and require only 20 electrical ports for sending and receiving electrical signals. For comparison, some of the standard mapping technologies require 200 electrical ports. In other words, embodiments of the present invention can reduce the number of required electrical ports by a factor of up to 10 or greater when compared to the requirements for some of the standard technologies.

As stated earlier, suitable controllers for embodiments of the present invention may include one or more microprocessors. Many of today's commercially available microprocessors may have 4, 8, or 16 signal output ports and 4, 8, or 16 signal input ports. For a typical integrated microprocessor with 8 analog inputs and 8 digital outputs, a sensor array having 64 sensors can be control. This means that it may be possible to obtain a total of 64 measurements substantially simultaneously.

Figure 3:
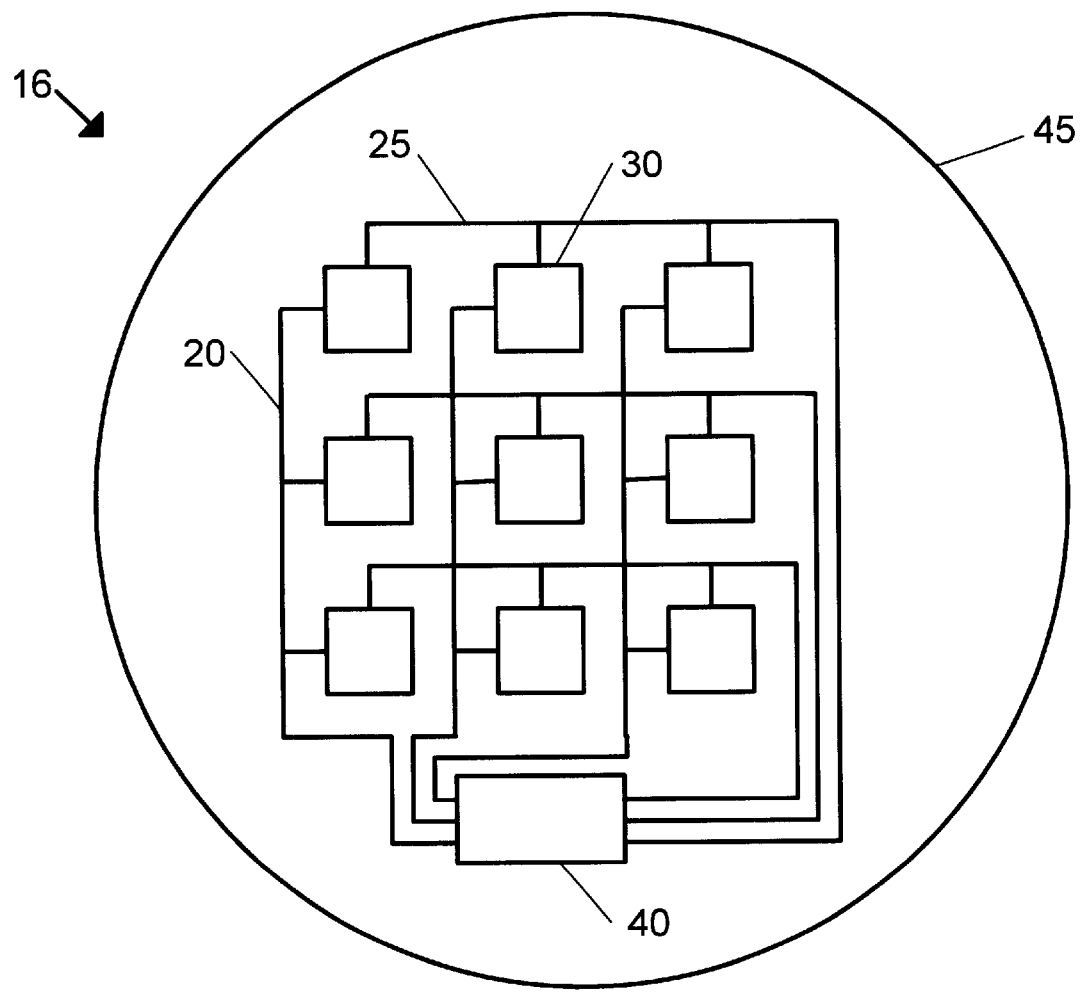
FIG. 3 is a diagram of a top view of an embodiment of the present invention.

Reference is now made to FIG. 3 wherein there is shown a top view of an embodiment of the present invention. A sensor apparatus 16 is shown having output electrical conductors 20, input electrical conductors 25, sensors 30, controller 40, and substrate 45. Conductors 20, conductors 25, sensors 30, and substrate 45 are essentially the same as those described for the embodiment shown in FIG. 2. Unlike the embodiment shown in FIG. 2, the embodiment shown in FIG. 3 has controller 40 supported by substrate 45 so that sensors 30 and controller 40 can be handled together as a single unit.

Applications for the embodiment shown in FIG. 3 that involve relatively small substrates such as for example substrates about the size of semiconductor wafers, flatpanel display substrates, and photolithography mask preferably use controller 40 having a suitably small size. For such applications, controller 40 may include a microprocessor and sufficient accessory components for supporting the microprocessor operation for task such as applying electrical signals, measuring electrical signals, processing data, storing data, and transmitting information.

In preferred embodiments, sensor apparatus 16 further includes capabilities for substantially autonomous operation. One or more capabilities for autonomous operation of sensor arrays have been described in U.S. patent application Ser. No. 09/643,614, now pending, filed Aug. 22, 2000; this application is incorporated herein, in its entirety, by this reference.

Figure 4:
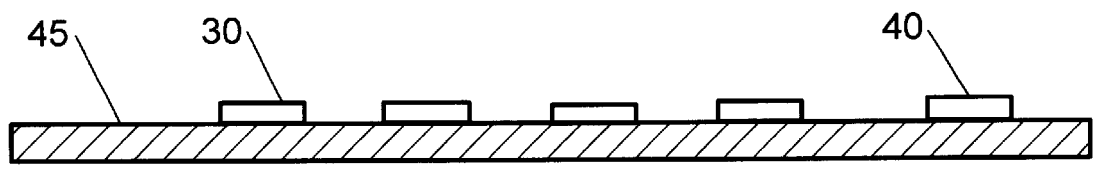
FIG. 4 is a diagram of a cross-sectional view of an embodiment of the present invention.

Reference is now made to FIG. 4 wherein there is shown a cross-sectional view of sensor apparatus 16 described in FIG. 3. The cross-sectional view shows a suitable arrangement for sensors 30, controller 40, and substrate 45. In this embodiment, sensors 30 are independent devices supported by substrate 45. Conductors 20 and conductors 25 are not shown in FIG. 4.

Figure 5:
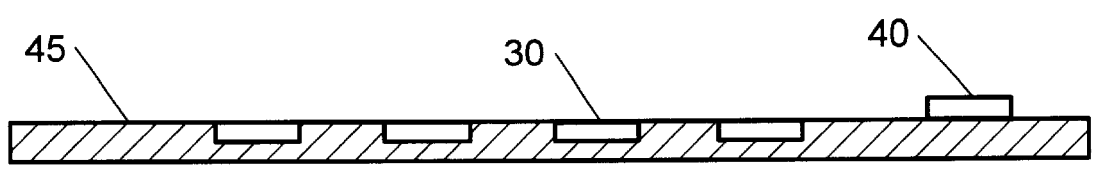
FIG. 5 is a diagram of a cross-sectional view of an embodiment of the present invention.

Reference is now made to FIG. 5 wherein there is shown a cross-sectional view of sensor apparatus 16 described in FIG. 3. The cross-sectional view shows a suitable arrangement for sensors 30, controller 40, and substrate 45. Conductors 20 and conductors 25 are not shown in FIG. 5. In this embodiment, sensors 30 are fabricated as integral parts of substrate 45. This embodiment is more suitable when substrate 45 comprises a semiconductor material or other material that can be used for fabricating sensors 30.

Figure 6:
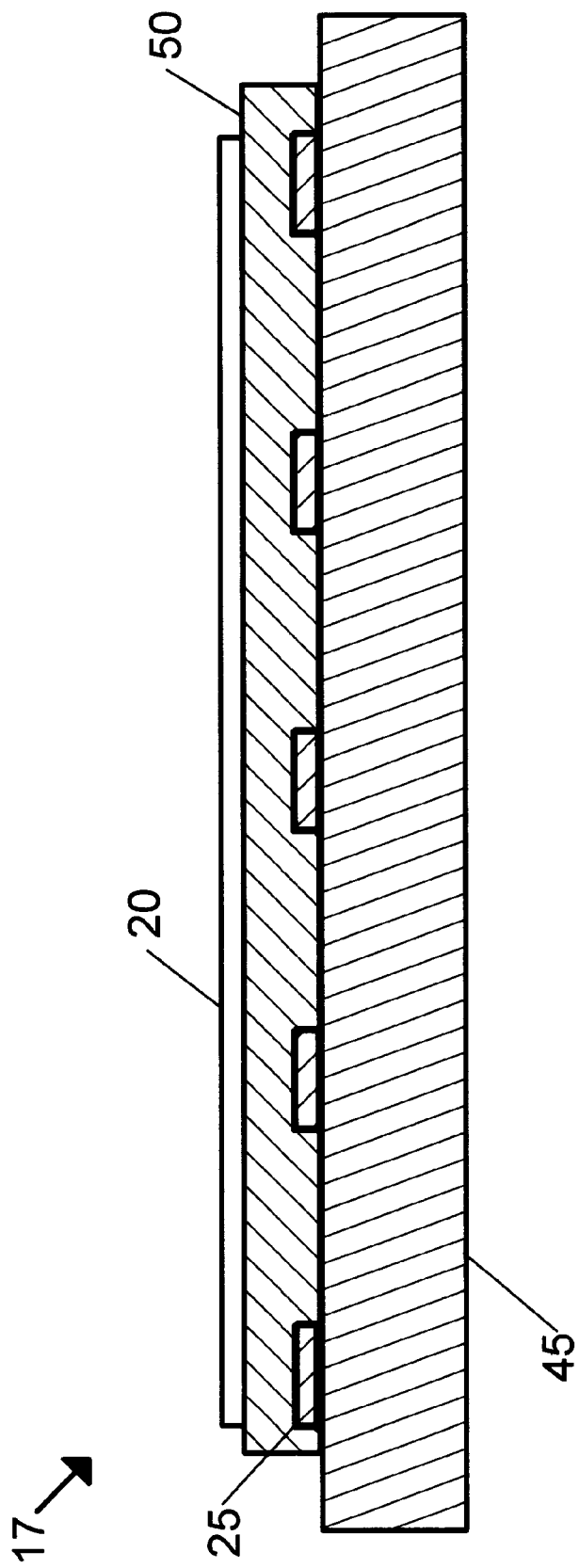
FIG. 6 is a diagram of a cross-sectional view of an embodiment of the present invention.

Reference is now made to FIG. 6 wherein there is shown a cross-sectional view of a sensor array 17 according to an embodiment of the present invention. Sensor array 17 includes output electrical conductors 20, input electrical conductors 25, substrate 45, and a layer of parameter sensitive material 50. In this specific embodiment, conductors 20 and conductors 25 are arranged so that they are substantially perpendicular. Parameter sensitive material 50 is sandwiched between conductors 20 and conductors 25 so that parameter sensitive material 50 contacts conductors 20 and conductors 25 so that parameter sensitive material 50 forms crosspoint connections between conductors 50 and conductors 25 at one or more crossing points for conductors 20 and conductors 25. Substrate 45 serves as a support for the sandwiched structure formed by conductors 20, conductors 25, and parameter sensitive material 50.

In some embodiments, parameter sensitive material 50 may be substantially continuous between two or more crosspoint connections. The sensors for sensor array 17 comprise the crosspoint connections formed by parameter sensitive material 50 across conductors 20 and conductors 25. The apparent locations of sensors are defined by the locations of the contacts to conductors 20 and conductors 25. In preferred embodiments, parameter sensitive material 50 comprises a substantially continuous, substantially uniform layer of sensing material, so that two or more individual sensors are substantially not electrically isolated from each other.

Suitable materials that can be used for parameter sensitive material 50 depend upon the type of parameters to be measured and the measurement conditions. Examples of the types of material that may be suitable for parameter sensitive material 50 are photoconductive materials, thermistor materials, and electric field sensitive doped silicon regions.

Figure 7:
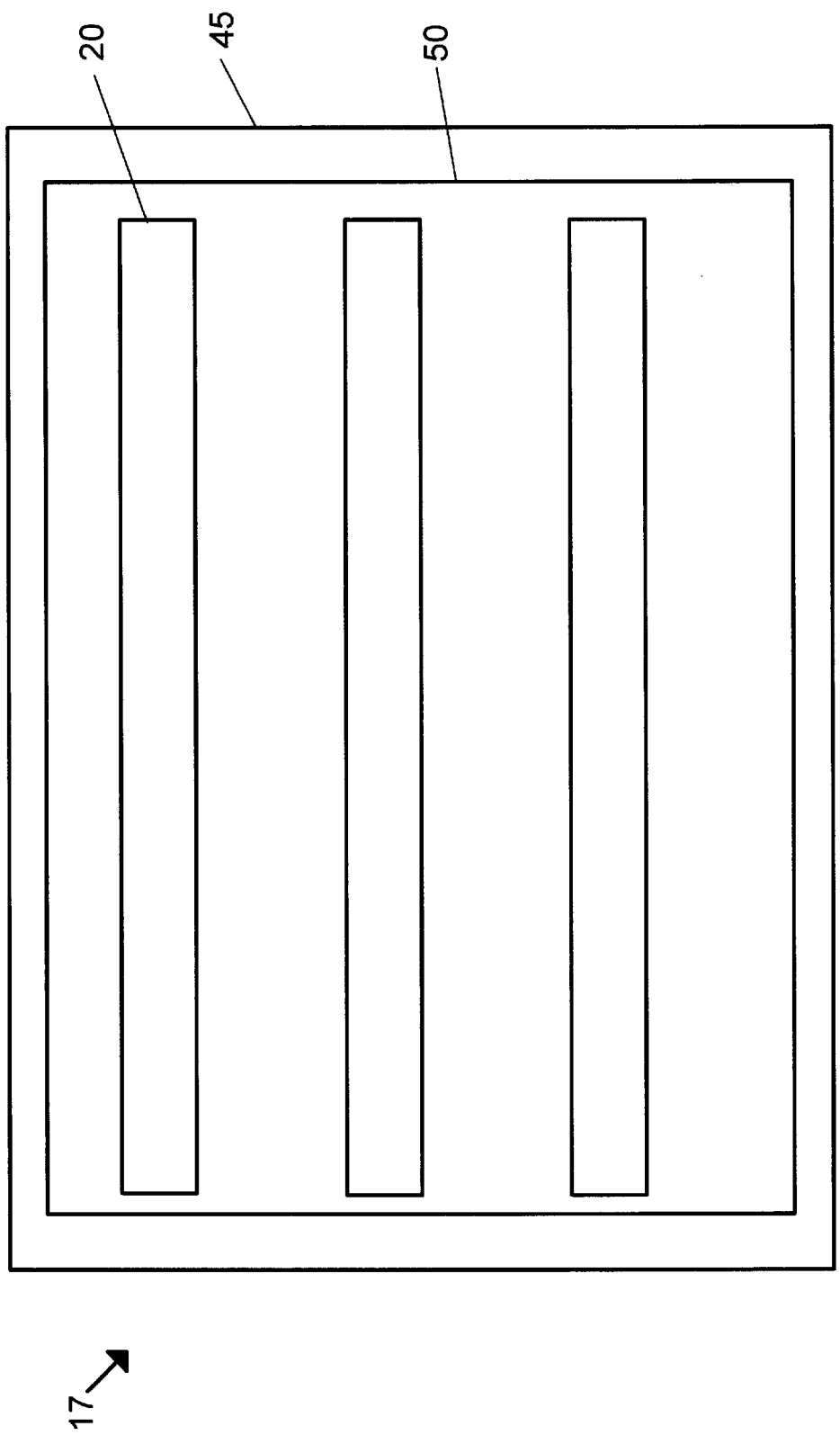
FIG. 7 is a diagram of a top view of an embodiment of the present invention.

Reference is now made to FIG. 7 wherein there is shown a top view for the embodiment of the present invention shown in FIG. 6. Sensor apparatus 17 includes conductors 20, substrate 45, and parameter system material 50. Conductors 25 are not shown in FIG. 7.

The examples presented for embodiments of the present invention illustrated in FIG. 1 and FIG. 1a demonstrate the use of aspects of the disclosed invention in a relatively simple form. Specifically, the examples used thermistors that are isolated, linear, two terminal devices. It is to be understood that these examples are not indications of the limits of the present invention. In fact, only the two-terminal characteristic of the example sensors is essential for practicing aspects the present invention.

In preferred embodiments, an electrical impedance property of the sensor is a reproducible function of the parameter to be measured, or there is the capability of representing information from the sensor as an electrical impedance property. The mathematical algorithms used to extract an individual sensor measurement from the matrix of measurements are dependent upon the sensor characteristics. It should be obvious to one of ordinary skill in the art that a variety sensor arrangements and structures can be used in practicing aspects of the present invention.

Another embodiment of the present invention includes sensors having nonlinear impedance characteristics such as semiconductor junctions and/or inversion/depletion layers. Analysis of the data obtained from nonlinear electrical impedance functionality can be achieved using well-known iterative, nonlinear fitting algorithms. In a further embodiment, the data analysis capabilities are incorporated in the controller.

Another embodiment of the present invention includes active sensors such as sensors that include MOSFET structures wherein the device impedance characteristics are modulated or effected by the parameter being measured.

Another embodiment of the present invention includes sensor arrays having different types of sensors within the same network. In this configuration, multiple physical parameters may be measured substantially simultaneously. An example would be sensor arrays that include thermistors and photoconductors on the same network. In preferred embodiments, each sensor structure has well characterized impedance characteristics.

Clearly, embodiments of the present invention can be used for a wide variety of applications that require data acquisition for highly resolved spatial parameter mapping and temporal parameter mapping. Embodiments of the present invention allow the use of large number of sensors and different types of sensors in the same network. The complexity of the electrical wiring for sensor arrays may be substantially reduced when compared to standard methods. Furthermore, embodiments of the present invention allow increased efficiency for the use of computer-related resources for managing the data collection.

Capabilities and features of embodiments of the present invention are particularly suited for applications involving development, optimization, monitoring, and control of processes and process tools used for processing workpieces such as, for example, semiconductor wafers, photolithography mask, and flat panel displays.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. An apparatus comprising:
    at least two output electrical conductors;
    at least one input electrical conductor;
    at least two sensors, the sensors being capable of sensing a parameter and indicating the parameter as an electrical impedance;
    the sensors being connected with the output electrical conductors and with the input electrical conductor so as to form an array of crosspoint connections;
    a controller, the controller being connected with the output electrical conductors and with the input electrical conductor, the controller being capable of applying electrical signals to the output electrical conductors, the controller being capable of measuring electrical signals received from the input electrical conductor;
    the controller being capable of at least one of:
        a) storing information representative of the measurements of the electrical signals received from the input electrical conductors,
        b) calculating the electrical impedance of each of the sensors using an algorithm, information of the electrical signals applied to the output electrical conductors, and measured electrical signals received from the input electrical conductors, and
        c) transmitting information received from the sensors.

2. The apparatus of claim 1 wherein the at least one input electrical conductor comprises a plurality of input electrical conductors.

3. The apparatus of claim 2 further comprising a substrate for supporting the output electrical conductors, the input electrical conductors, and the sensors.

4. The apparatus of claim 2 further comprising a plurality of reference elements, the reference elements being connected with the output electrical conductors and with the input electrical conductors so as to form crosspoint connections.

5. The apparatus of claim 4 wherein each of the input electrical conductors has at least one reference element connected thereto.

6. The apparatus of claim 1 wherein the algorithm includes equations for summing impedances in series and summing impedances in parallel.

7. The apparatus of claim 1 wherein the sensors are capable of indicating the parameter as an electrical impedance that includes at least one of resistance, capacitance, and inductance.

8. The apparatus of claim 1 wherein the sensors comprise a parameter sensitive resistor.

9. The apparatus of claim 1 wherein the sensors comprise a thermistor.

10. The apparatus of claim 1 wherein the sensors comprise a photoresistor.

11. The apparatus of claim 1 wherein the sensors comprise a nonlinear electronic junction.

12. The apparatus of claim 1 wherein the sensors comprise a photodiode.

13. The apparatus of claim 1 wherein the sensors comprise an active electronic device.

14. The apparatus of claim 1 wherein the sensors comprise a MOSFET device.

15. The apparatus of claim 14 wherein the sensor impedance is a function of a voltage applied to the gate of the MOSFET device.

16. The apparatus of claim 1 wherein the sensors comprise a substantially continuous layer of parameter sensitive material shared by at least two of the sensors.

17. The apparatus of claim 1 wherein the controller comprises a microprocessor.

18. The apparatus of claim 1 further comprising a substrate, and wherein the sensors, the output electrical conductors, and the input electrical conductors are formed on the substrate.

19. The apparatus of claim 1 wherein the plurality of sensors comprise at least two types of sensors.

20. The apparatus of claim 1 wherein at least one of the sensors includes circuitry for converting the measured parameter into a corresponding electrical impedance.

21. A method for obtaining data from an array of sensors in a crosspoint network, the method being performed using sensors capable of representing parameters as electrical impedance, the method comprising the steps of:

applying a pattern of electrical signals to the sensors;

measuring electrical signals from the sensors;

deriving measurement data for each of the sensors using the measured electrical signals and algorithms.

22. The method of claim 21 wherein the individual response of one of the sensors is calculated from measuring electrical signals when the pattern of electrical signals comprises a plurality of electrical source states.

23. The method of claim 21 wherein the pattern of electrical signals includes voltages having at least two discrete magnitudes.

24. The method of claim 21 wherein the pattern of electrical signals includes currents having at least two discrete magnitudes.

25. The method of claim 21 wherein the method is carried out using input electrical conductors and output electrical conductors arranged to form the cross point network.

26. The method of claim 21 wherein the pattern of electrical signals includes alternating electrical signals.

27. An apparatus comprising:

a plurality of output electrical conductors;

a plurality of input electrical conductors;

a plurality of sensors capable of presenting a parameter as an electrical impedance, each of the sensors being connected with one of the output electrical conductors and one of the input electrical conductors so as to form an array of crosspoint connections; and a plurality of reference elements, the reference elements being connected with the output electrical conductors and with the input electrical conductors so as to form crosspoint connections;

whereby application of electrical signals to the output electrical conductors and measurement of electrical signals at the input electrical conductors provide sufficient information to derive the measured property of each sensor using algorithms.

* * * * *